US012745573B2

(12) United States Patent
Derakhshandeh et al.

(10) Patent No.: US 12,745,573 B2
(45) Date of Patent: Sep. 22, 2026

(54) QUANTUM BIT CHIP HAVING A STACK OF QUBIT WAFERS AND SPACER WAFERS, AND A METHOD FOR FABRICATING THE QUANTUM BIT CHIP

(71) Applicant: IMEC VZW, Leuven (BE)

(72) Inventors: Jaber Derakhshandeh, Tienen (BE); Iuliana Radu, Heverlee (BE); Eric Beyne, Heverlee (BE); Bogdan Govoreanu, Hulshout (BE)

(73) Assignee: Imec vzw, Leuven (BE)

( * ) Notice: Subject to any disclaimer, the term of this patent is extended or adjusted under 35 U.S.C. 154(b) by 576 days.

(21) Appl. No.: 18/060,389

(22) Filed: Nov. 30, 2022

(65) Prior Publication Data

US 2023/0200263 A1 Jun. 22, 2023

(30) Foreign Application Priority Data

Dec. 8, 2021 (EP) .................................... 21213080

(51) Int. Cl.
*H10N 69/00* (2026.01)
*H10W 70/60* (2026.01)
(Continued)

(52) U.S. Cl.
CPC .......... *H10N 69/00* (2023.02); *H10W 70/611* (2026.01); *H10W 70/635* (2026.01);
(Continued)

(58) Field of Classification Search
CPC ... H01L 23/5384; H01L 23/552; H01L 24/05; H01L 24/06; H01L 24/08; H01L 24/13;
(Continued)

(56) References Cited

U.S. PATENT DOCUMENTS 9,379,303 B2 6/2016 Gambetta et al.
9,495,644 B2 11/2016 Chudak et al.
(Continued)

FOREIGN PATENT DOCUMENTS

EP 3399548 A1 11/2018
WO 2017131831 A2 8/2017
(Continued)

OTHER PUBLICATIONS

Extended European Search Report and Written Opinion, Application No. EP 21213080.1, mailed Jun. 15, 2022, 9 pages.
(Continued)

*Primary Examiner* — Wael M Fahmy
*Assistant Examiner* — Tiberiu Dan Onuta
(74) *Attorney, Agent, or Firm* — McDonnell Boehnen Hulbert & Berghoff LLP

(57) ABSTRACT

The present disclosure relates to a quantum bit (qubit) chip. The qubit chip includes two or more qubit wafers arranged along a common axis and one or more spacer elements. The spacer elements and the qubit wafers are alternately arranged on the common axis. The qubit chip further includes a conductive arrangement configured to electrically connect the two or more qubit wafers, where the conductive arrangement includes at least one superconducting via per each qubit wafer of the two or more qubit wafers and each spacer element of the one or more spacer elements, the at least one superconducting via passing through the qubit wafer or spacer element.

20 Claims, 12 Drawing Sheets

(51) Int. Cl.
*H10W 70/63* (2026.01)
*H10W 72/20* (2026.01)
*H10W 72/90* (2026.01)
*H10W 90/00* (2026.01)

(52) U.S. Cl.
CPC ........ *H10W 72/244* (2026.01); *H10W 72/248* (2026.01); *H10W 72/252* (2026.01); *H10W 72/942* (2026.01); *H10W 72/944* (2026.01); *H10W 72/952* (2026.01); *H10W 90/724* (2026.01); *H10W 90/794* (2026.01)

(58) Field of Classification Search
CPC ......... H01L 24/14; H01L 24/16; H01L 24/81; H01L 24/94; H01L 2224/0557; H01L 2224/05609; H01L 2224/06181; H01L 2224/08225; H01L 2224/13025; H01L 2224/13109; H01L 2224/14181; H01L 2224/16227; H01L 2224/16235; H01L 2224/17181; H01L 2224/81193; H01L 2224/81409; H01L 2224/94; H01L 25/16; H01L 25/0657; H01L 25/50; H01L 2225/06513; H01L 2225/06541; H01L 2225/06572; H10N 69/00; G06N 10/40; G06N 10/20
See application file for complete search history.

(56) References Cited

U.S. PATENT DOCUMENTS

| | | | | |
|---|---|---|---|---|
| 9,971,970 | B1 | 5/2018 | Rigetti et al. | |
| 10,134,972 | B2 | 11/2018 | Oliver et al. | |
| 10,608,158 | B2 * | 3/2020 | Abraham | H10N 60/0912 |
| 10,984,335 | B2 | 4/2021 | Bronn et al. | |
| 10,985,308 | B1 * | 4/2021 | Vodrahalli | G06N 10/40 |
| 2016/0249450 | A1 * | 8/2016 | Min | H05K 1/185 |
| 2018/0331058 | A1 * | 11/2018 | Abraham | H10N 69/00 |
| 2020/0012961 | A1 | 1/2020 | Kelly et al. | |
| 2020/0119251 | A1 * | 4/2020 | Yohannes | H01L 24/06 |
| 2020/0185512 | A1 * | 6/2020 | Voinigescu | G06N 10/40 |

FOREIGN PATENT DOCUMENTS

| | | | |
|---|---|---|---|
| WO | 2017131831 | A3 | 9/2017 |
| WO | 2019004991 | A1 | 1/2019 |

OTHER PUBLICATIONS

Rosenberg, Danna, Steven J. Weber, David Conway, Donna-Ruth W. Yost, Justin Mallek, Gregory Calusine, Rabindra Das et al. “Solid-state qubits: 3D integration and packaging.” IEEE Microwave Magazine 21, No. 8 (2020): 72-85.

Niedzielski, Bethany M., David K. Kim, Mollie E. Schwartz, Danna Rosenberg, Greg Calusine, Rabi Das, Alexander J. Melville et al. “Silicon hard-stop spacers for 3D integration of superconducting qubits.” In 2019 IEEE International Electron Devices Meeting (IEDM), pp. 31-33. IEEE, 2019.

Rosenberg, D., D. Kim, R. Das, D. Yost, S. Gustavsson, D. Hover, P. Krantz et al. “3D integrated superconducting qubits.” npj quantum information 3, No. 1 (2017): 1-5.

* cited by examiner

QUANTUM BIT CHIP HAVING A STACK OF QUBIT WAFERS AND SPACER WAFERS, AND A METHOD FOR FABRICATING THE QUANTUM BIT CHIP

CROSS-REFERENCE TO RELATED APPLICATIONS

The present application is a non-provisional patent application claiming priority to European patent application no. 21213080.1, filed on Dec. 8, 2021, the contents of which are hereby incorporated by reference.

FIELD OF THE DISCLOSURE

The present disclosure relates to quantum computers, and more specifically to a quantum bit (qubit) chip and a method for fabricating a qubit chip.

The qubit chip of the present disclosure may comprise two or more qubit wafers and may be used for high performance quantum computer applications. The method of the present disclosure may enable three-dimensional (3D) stacking of different qubit wafers for high performance quantum computer applications.

BACKGROUND

Generally, superconducting qubit chips are complex chips having dense arrays of qubit devices. Conventional qubit chips are based on multi-qubit wafers having many superconducting qubit devices which are provided in a planar architecture.

A conventional qubit chip includes qubit wafers and interconnects. The qubit wafers comprise one or more qubit devices each. Furthermore, the qubit wafers and the respective interconnects may be co-fabricated on a single chip surface. However, increasing the number of the qubit wafers in the qubit chip increases the interconnect density. Furthermore, increasing the interconnect density in the qubit plane of a quantum computer may increase a quantum decoherence of the qubit devices in the qubit wafers, and may thus further increase the complexity of quantum error correction algorithms that are used.

SUMMARY

In view of the above, embodiments of the present disclosure aim to provide an improved qubit chip and an improved method for manufacturing the qubit chip.

Thereby, a potential benefit is to provide a qubit chip that has a higher interconnect density. Another potential benefit is to provide an improved interconnect arrangement connecting the qubit wafers of the qubit chip. Another potential benefit is to eliminate or reduce distortions of the electric fields of the qubit devices of the qubit wafers.

A first aspect of the disclosure provides a qubit chip comprising two or more qubit wafers arranged along a common axis, one or more spacer elements, wherein the spacer elements and the qubit wafers are alternately arranged on the common axis, and a conductive arrangement configured to electrically connect the two or more qubit wafers, wherein the conductive arrangement comprises at least one superconducting (SC) via per each respective qubit wafer of the two or more qubit wafers and each respective spacer element of the one or more spacer elements, the at least one SC via passing through the respective qubit wafer or spacer element.

The qubit chip may be an electronic device and may be implemented in, for example, a quantum computer, a low temperature electronic device such as a low temperature aerospace device, a low temperature medical device, e.g., a magnetic resonance imaging (Mill) chip, a cyclotron for high energy physics research, a cryogenic oxygen generator, or the like.

The qubit chip of the first aspect may comprise the two or more qubit wafers. Each qubit wafer may comprise a plurality of qubit devices. For example, the plurality of qubit devices of each qubit wafer may comprise at least one of an SC qubit device and a spin qubit device. For instance, a qubit wafer from the two or more qubit wafers may be partitioned such that it includes both the SC qubit device and the spin qubit device, or includes only SC qubit devices, or includes only spin qubit devices.

The qubit chip of the first aspect may further comprise the one or more spacer elements. The spacer elements may be, for example, a spacer wafer, a spacer pillar, a graphene sheet, indium pillars, or the like.

For example, the qubit chip may include two qubit wafers stacked above each other and one graphene sheet provided in between the two qubit wafers.

Furthermore, the qubit chip may include two qubit wafers stacked above each other and one spacer pillar may be provided in between the two qubit wafers. The spacer pillar may be a superconducting metal such as indium (In) pillar that may be grown by indium (In) electroplating, for example, in a same way as conventional copper (Cu) plating in which it is able to grow pillars at least up to 50-100 μm height.

The two or more qubit wafers and the one or more spacer elements are alternately arranged on the common axis. That is, the two or more qubit wafers and the one or more spacer elements are arranged one after the other on the common axis, wherein the qubit wafers and one or more spacer elements are arranged in turns along the common axis. In other words, a spacer element is not adjacent to another spacer element along the common axis, and a qubit wafer is not adjacent to another qubit wafer along the common axis.

The spacer elements may be spacer wafers. For example, a spacer wafer such as an interposer may be provided in between each adjacent pair of the two or more qubit wafers. Thereby, a distortion of the qubit devices in these qubit wafers may be reduced, or at least considerably eliminated. For instance, by providing the one or more spacer wafers between two adjacent qubit wafers, the qubit chip may in total show a high quantum coherence, since there is no dielectric layer provided on the qubit wafers, and therefore there is no distortion in the electric field of the other qubit devices. A spacer wafer may also be provided between the lowest qubit wafer of the stacked qubit wafers. A CMOS readout wafer on which these wafers are arranged is also provided.

The two or more qubit wafers, for example the qubit devices of the qubit wafers, may be based on superconducting materials such as aluminum (Al), titanium nitride (TiN), and niobium (Nb) and may be provided on a substrate such as silicon (Si) or sapphire ($Al_2O_3$), or the like, without limiting the present disclosure to a specific type of qubit devices.

The conductive arrangement may comprise one or more of: a vertical interconnect, the at least one SC via, an SC bump, a partial SC bump, an SC pad, a partial SC pad, an indium bump, an indium pad, or the like.

Further, the SC via passes through the two or more qubit wafers of the qubit chip. Moreover, the SC via passes through the one or more spacer elements of the qubit chip. For example, in each qubit wafer, a vertical interconnect may be provided in a form of an SC nano via or an SC-nano through silicon via (SC-nTSVs). Moreover, the vertical interconnect may comprise an SC bump or SC pad for connecting the qubit wafers to the spacer wafers. Therefore, high density vertical interconnects may be obtained by vertically connecting the two or more qubit wafers.

Furthermore, in each spacer wafer, a vertical interconnect may be provided in a form of SC micro-via or SC-μTSVs. Moreover, the vertical interconnect may comprise an SC bump or an SC pad for connecting the spacer wafers to the qubit wafers.

The conductive arrangement, for example, its vertical interconnects of the qubit wafers and the spacer wafers, may enable achieving high density qubits through high density vertical interconnects.

To improve the qubit chip, the lateral interconnects in the qubit chip may be removed, and the qubit density may be increased.

The qubit chip of the first aspect is thus configured such that a smart partitioning of different quantum elements (e.g., different qubit devices such as SC qubit devices or spin qubit devices, resonators, and microwave elements) can be designed. For example, in some implementation forms, it may be possible to provide different types of qubit devices in the two or more qubit wafers of the qubit chip.

Furthermore, a fabrication of those quantum elements in each qubit wafer can be well controlled. For example, it may be possible to add a thick silicon wafer such as the spacer wafer in between adjacent qubit wafers. Further, a high density vertical interconnection of all qubit wafers may be achieved, and the interposer (which may be a thick Si wafer) may act as an electromagnetic interference (EMI) shield to separate different quantum elements and different qubit wafers.

In an implementation form of the first aspect, the two or more qubit wafers are based on similar qubit devices.

In an implementation form of the first aspect, the two or more qubit wafers are based on different types of qubit devices. For example, the two or more qubit wafers may be based on a spin qubit device, a superconducting qubit device, or being partitioned such that both types of qubits are used.

In an implementation form of the first aspect, the two or more qubit wafers are arranged one above the other or are stacked above each other along the common axis.

In a further implementation form of the first aspect, each of the two or more qubit wafers comprises a plurality of qubit devices, and the plurality of qubit devices comprise at least one of an SC qubit device and a spin qubit device.

The two or more qubit wafers may be based on any qubit devices. For instance, each of the qubit wafers may be a lithographically defined wafer having an electrical circuit comprising one or more Josephson junctions, inductors, capacitors, and interconnects.

For example, a partitioning may be performed so that the qubit wafer further comprises Josephson junctions, capacitors, and resonators. Furthermore, these components may be provided on separate locations on the qubit wafer, or they may be provided on another qubit wafer or spacer wafer. This may enable a more efficient fabrication of the Josephson junctions on the two or more qubit wafers of the qubit chip.

In a further implementation form of the first aspect, each of the two or more qubit wafers comprises one or more interconnects configured to electrically connect the plurality of qubit devices of the qubit wafer, and/or the conductive arrangement is configured to electrically connect the plurality of qubit devices of the two or more qubit wafers.

This may provide the potential benefit that the lateral interconnects may be removed, and a density of the qubit devices may be increased on any qubit wafer.

In a further implementation form of the first aspect, the conductive arrangement comprises at least one of: an SC bump configured to electrically couple a qubit wafer to a spacer element, a partial SC bump configured to electrically couple a qubit wafer to a spacer element, or an SC pad configured to electrically couple a qubit wafer to a spacer element.

This may enhance the performance of the qubit chip. For example, an enhanced signal routing vertically and/or laterally may be achieved.

In a further implementation form of the first aspect, each of the two or more qubit wafers has a thickness of less than 1 μm, for example, a thickness in a range of 400-600 nm.

In a further implementation form of the first aspect, the spacer elements are spacer wafers, and a thickness of each spacer wafer is larger than a thickness of each qubit wafer.

By providing thicker spacer wafers in between the different qubit wafers, the spacer wafers may function as shields between the qubit wafers, while at the same time they may carry current vertically using, for instance, high density superconducting interconnects.

In a further implementation form of the first aspect, the thickness of each spacer wafer is within a range of 50-100 μm.

In a further implementation form of the first aspect, the qubit chip further comprises a complementary metal-oxide-semiconductor (CMOS) readout wafer or device, wherein the CMOS readout wafer or device is configured to readout one or more qubits of each qubit wafer or to selectively couple each qubit to a readout resonator and/or to a microwave driver.

For example, the two or more qubit wafers or the spacer wafer, e.g., in a form of a multi-stack, may be bonded on the CMOS readout wafer of the qubit chip. For example, the bonding can be performed through die to wafer bonding.

In a further implementation form of the first aspect, the two or more qubit wafers or the spacer wafer, e.g., in the form of a multi-stack, may be bonded on the CMOS readout wafer of the qubit chip, via device-to-device bonding. For example, the bonding can be through die-to-die, or optionally, the bonding can be through die-(stack)-to-(CMOS) wafer.

A second aspect of the disclosure provides a method for fabricating a qubit chip, the method comprising fabricating two or more qubit wafers, fabricating one or more spacer elements, alternately arranging the spacer elements and the qubit wafers on a common axis, and fabricating a conductive arrangement, wherein the conductive arrangement is configured to electrically connect the two or more qubit wafers, wherein the conductive arrangement comprises at least one superconducting (SC) via per each respective qubit wafer of the two or more qubit wafers and each respective spacer element of the one or more spacer elements, the at least one SC via passing through the respective qubit wafer or spacer element.

The method of the second aspect may enable vertically stacking different quantum elements and different types of quantum computers or qubit wafers, in order to achieve high density qubit devices. This may be achieved through high density vertical interconnects and isolated qubit wafers and may result in an improvement of the quantum coherence of the qubit devices. For example, the qubit wafer's in-plane interconnects may be removed, which may result in easier quantum error correction algorithms.

In an implementation form of the second aspect, fabricating the two or more qubit wafers comprises fabricating a first qubit wafer and a second qubit wafer, fabricating the one or more spacer elements comprises fabricating a first spacer wafer and a second spacer wafer, and fabricating the conductive arrangement comprises providing a plurality of first SC bumps or first SC pads onto the first qubit wafer and the second qubit wafer, and providing a plurality of second SC bumps or second SC pads onto the first spacer wafer and the second spacer wafer, wherein the method further comprises bonding the first qubit wafer to the first spacer wafer via the first SC bumps or the first SC pads on the first qubit wafer and the second SC bumps or the second SC pads on the first spacer wafer, and bonding the second qubit wafer to the second spacer wafer via the first SC bumps or the first SC pads on the second qubit wafer and the second SC bumps or the second SC pads on the second spacer wafer, and thinning the first spacer wafer and the second qubit wafer.

A further implementation form of the second aspect includes providing a plurality of third SC bumps or third SC pads onto the thinned second qubit wafer, providing a plurality of fourth SC bumps or fourth SC pads onto the thinned first spacer wafer, and bonding the thinned second qubit wafer to the thinned first spacer wafer via the third SC bumps or the third SC pads on the thinned second qubit wafer and the fourth SC bumps or fourth SC pads on the thinned first spacer wafer, in order to obtain a first stack for the qubit chip.

In a further implementation form of the second aspect, the method further comprises providing a second stack for the qubit chip, the second stack being substantially identical to the first stack, thinning the second spacer wafer of the first stack and the first qubit wafer of the second stack, providing a plurality of fifth SC bumps or fifth SC pads onto the thinned first qubit wafer of the second stack, providing a plurality of sixth SC bumps or sixth SC pads onto the thinned second spacer wafer of the first stack, and bonding the thinned first qubit wafer of the second stack to the thinned second spacer wafer of the first stack, via the fifth SC bumps or the fifth SC pads on the thinned first qubit wafer of the second stack and via the sixth SC bumps or sixth SC pads on the thinned second spacer wafer of the first stack, in order to obtain a third stack.

In a further implementation form of the second aspect, the first qubit wafer and/or the second qubit wafer are thinned to less than 1 μm, for example, to within a range of 400-600 nm, and/or the first spacer wafer and/or the second spacer wafer are thinned to less than 100 μm, for example, to within a range of 50-100 μm.

A further implementation form of the second aspect includes thinning a further spacer wafer of the third stack, providing a complementary metal-oxide-semiconductor (CMOS) readout wafer or device, and connecting the thinned further spacer wafer of the third stack to the CMOS readout wafer or device, in order to obtain the qubit chip.

The present disclosure is not limited to a specific order of the method of the second aspect or any of its implementation forms. For example, the steps of the method of the second aspect or any of its implementation forms may be reordered. For example, in some implementation forms, the thinning step may be performed after the bonding step or vice versa.

The method of the second aspect can achieve the same advantages as the qubit chip of the first aspect and may be extended by respective implementations as described above for the qubit chip of the first aspect. Further, the method of the second aspect provides the potential for 3D stacking of qubit wafers in wafer-level fabrication.

BRIEF DESCRIPTION OF THE FIGURES

The above, as well as additional, features will be better understood through the following illustrative and non-limiting detailed description of example embodiments, with reference to the appended drawings.

The above described aspects and implementations are explained in the following description of embodiments with respect to the enclosed drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
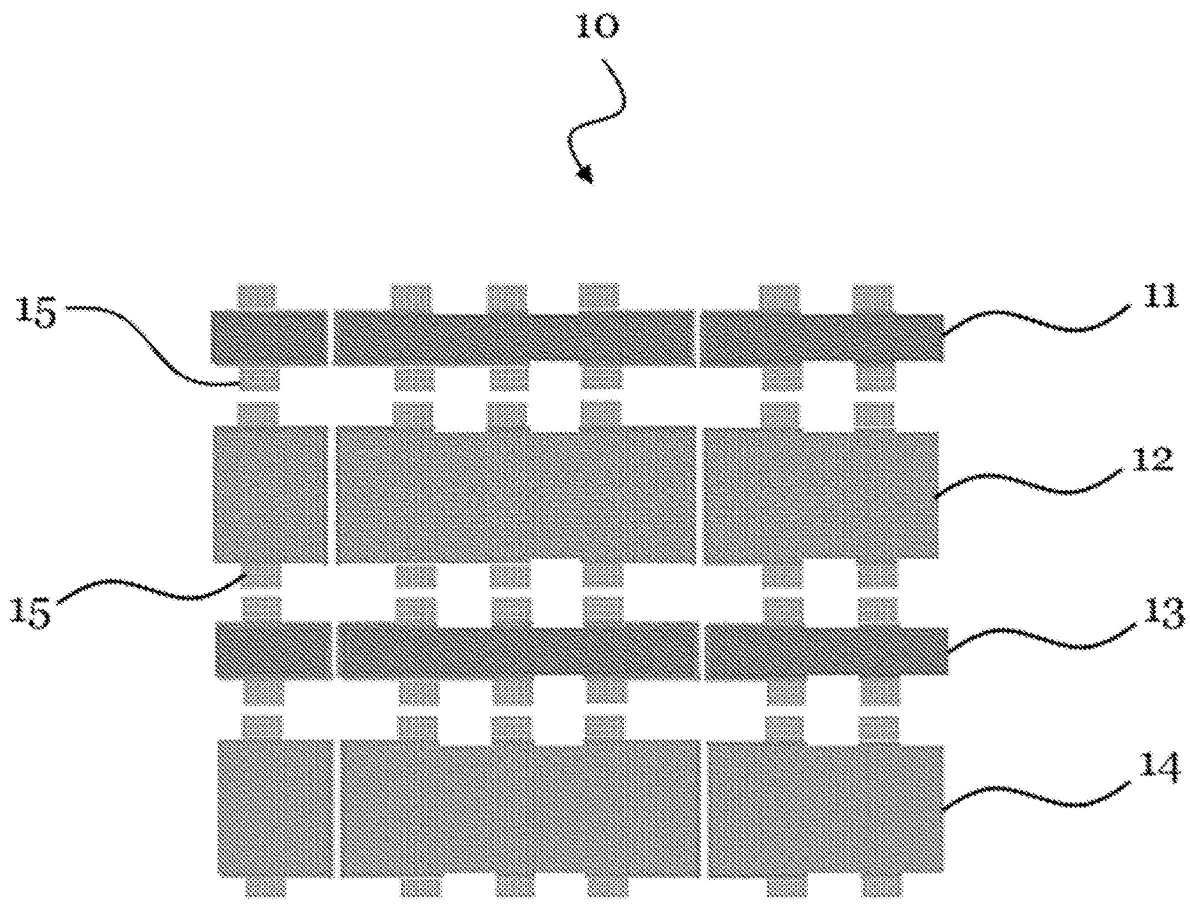
FIG. 1 shows elements of a qubit chip, according to an example.

FIG. 1 shows elements of a qubit chip 10, according to an embodiment of the disclosure.

The qubit chip 10 may be an electronic device and may be implemented in, for example, a quantum computer, a low temperature electronic device such as a low temperature aerospace device, a low temperature medical device, e.g., a magnetic resonance imaging (Mill) device, a cyclotron for high energy physics research, a cryogenic oxygen generator, or the like.

The qubit chip 10 comprises two or more qubit wafers 11, 13, which are arranged one after the other along a common axis.

The qubit chip 10 further comprises one or more spacer elements 12, 14, wherein the spacer elements 12, 14 and qubit wafers 11, 13 are alternately arranged on the common axis. That is, a spacer element 12, 14 is arranged between each of the qubit wafers 11, 13 which are arranged after another on the common axis.

For example, a thicker spacer element 12 may be placed in between thinner qubit wafers 11, 13. The thinner qubit wafers 11, 13 may be thinned qubit wafers, for instance, each having a thickness around 500 nm. The spacer elements 12, 14 may be thicker than the qubit wafers 11, 13.

For example, the qubit wafer 13 may be bonded to a spacer element 14, and afterwards, the qubit wafer 13 may be thinned. Further, another qubit wafer 11 can be bonded on another thicker spacer element 12. Moreover, the spacer element 12 may further be thinned. Afterwards, the thinned qubit wafer 13 may be arranged on (for example, bonded to) the thinned spacer element 12. Hence, the qubit wafers 11, 13 and the spacer elements 12, 14 are alternately arranged on the common axis.

The spacer elements 12, 14 may be spacer pillars, spacer wafers, interposer wafers, and may be used additionally as an interconnect path between the qubit wafers 11, 13. This may enable stacking multiple qubit wafers 11, 13, in order to combine different quantum elements or qubit devices of the different qubit wafers 11, 13.

The qubit chip 10 may have an improved performance. For example, since there might not be a dielectric layer present on each qubit wafer 11, 13, and an interconnection may be formed vertically through the spacer elements 12, 14, the performance of the qubit chip 10 may be better than for a case where the qubit wafers 11, 13 are covered with a dielectric layer, or the like.

The qubit chip 10 further comprises a conductive arrangement 15, which is configured to electrically connect the two or more qubit wafers 11, 13, wherein the conductive arrangement 15 comprises at least one SC via per each respective qubit wafer of the two or more qubit wafers 11, 13 and each respective spacer element of the one or more spacer elements 12, 14, the at least one SC via passing through the respective qubit wafer or spacer element.

The conductive arrangement 15 may be based on, for example, indium bumps, indium pads, or based on a direct connection of superconducting layers.

The qubit chip 10 may provide one or more of the following potential benefits:

Enabling a smart partitioning of different qubit devices of the qubit wafers 11, 13.

Easier fabrication of qubit devices in the qubit wafers 11, 13.

Improving the interconnections between the qubit wafers 11, 13, e.g., by providing a high-density vertical interconnection for all of the qubit wafers 11, 13.

Shielding and separating different qubit devices of the qubit wafers 11, 13.

Shielding and separating the different qubit wafers 11, 13.

Easier quantum error correction algorithms resulting in integrating higher number of qubits.

FIGS. 2A to 2J show an example of a procedure for fabricating elements of a qubit chip 10, according to an example of the disclosure.

Figure 2A:
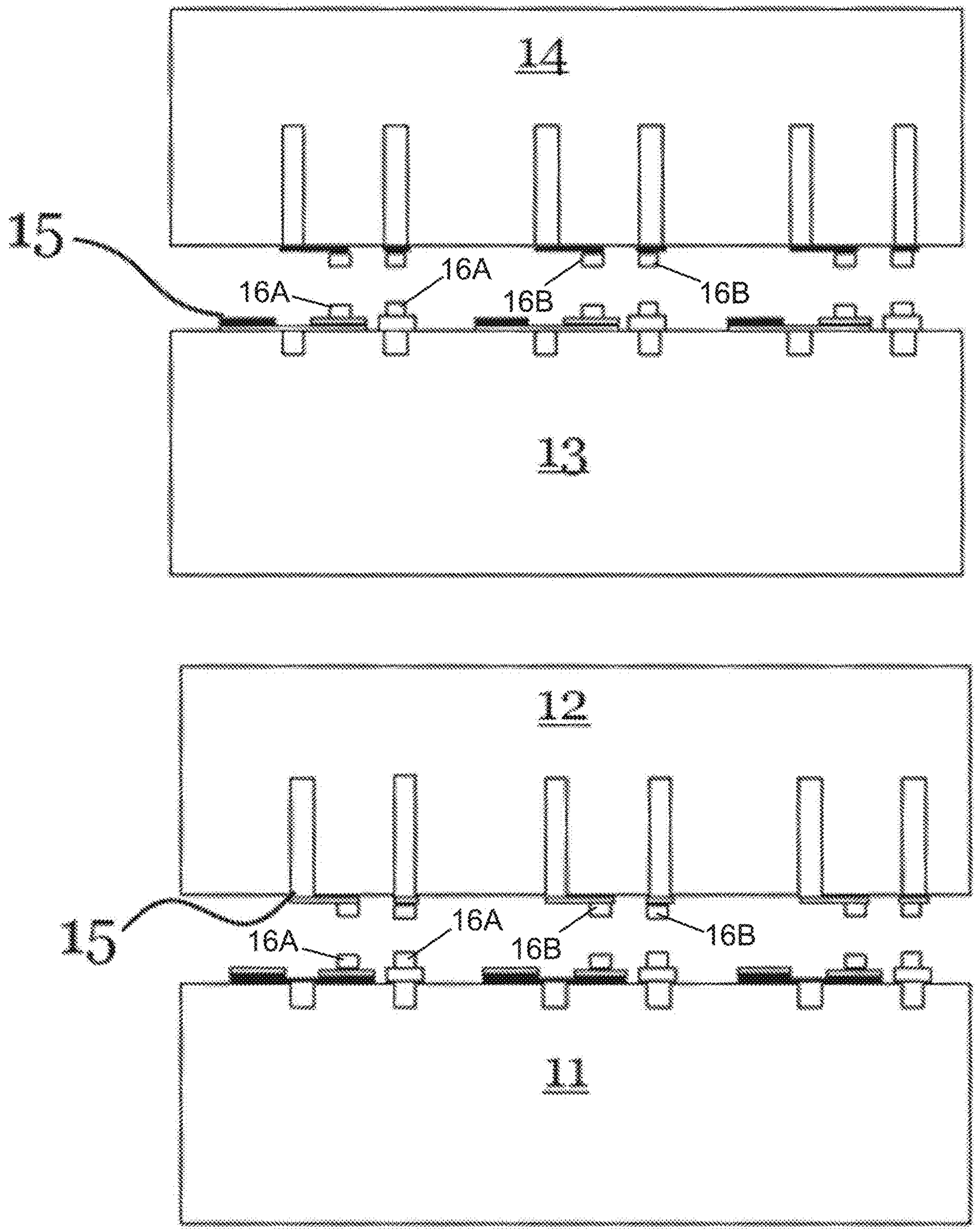
FIG. 2A shows a procedure for fabricating elements of a qubit chip, according to an example.

Reference is now made to FIG. 2A, in which the procedure may comprise fabricating a first qubit wafer 11 and a second qubit wafer 13.

The procedure may comprise fabricating a spacer element 12 (e.g., a spacer wafer) and a second spacer element 14 (e.g., a spacer wafer).

The procedure may comprise providing a plurality of first SC bumps 16A or first SC pads onto the first qubit wafer 11 and the second qubit wafer 13.

The procedure may comprise providing a plurality of second SC bumps 16B or second SC pads onto the spacer element 12 and the second spacer element 14.

Figure 2B:
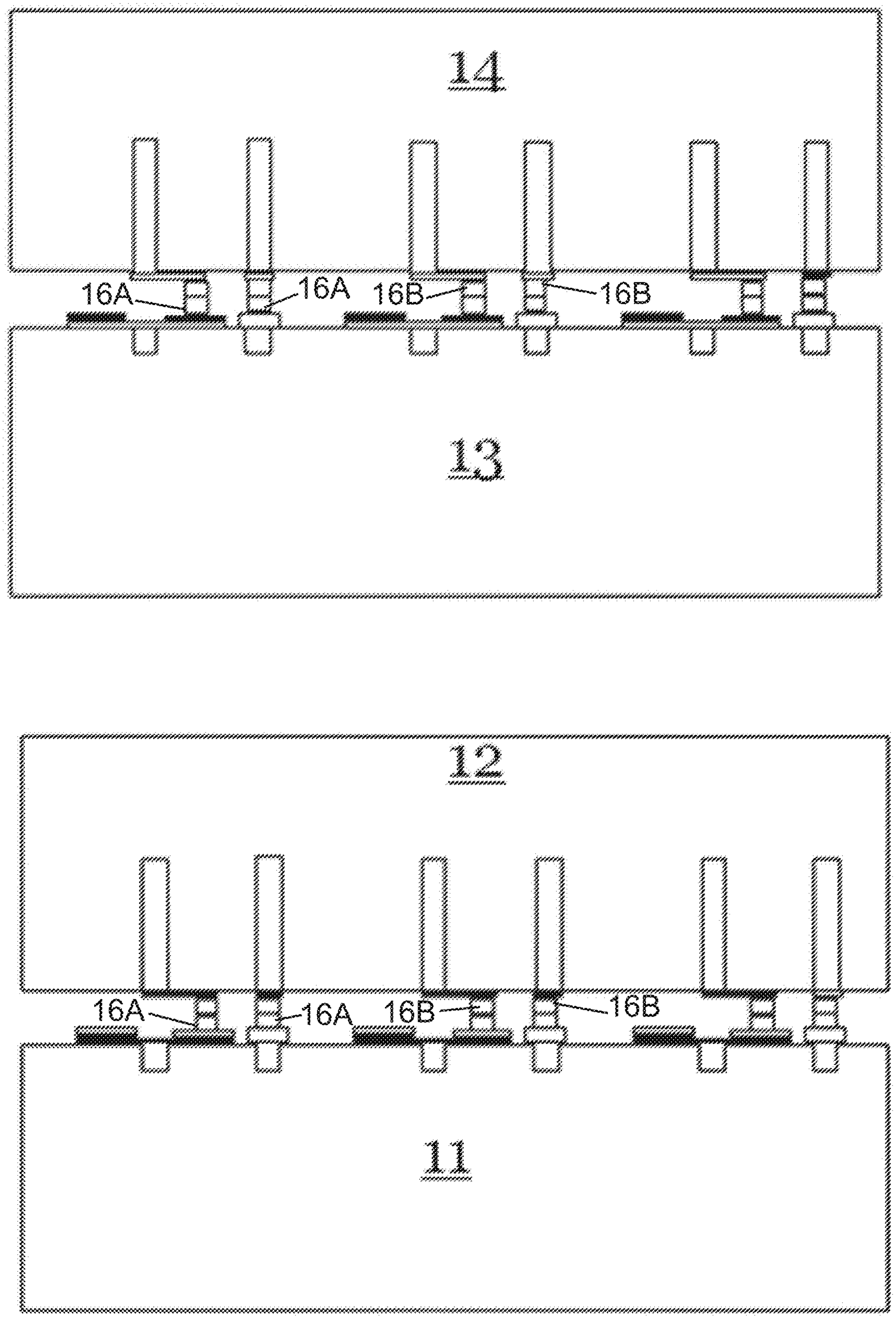
FIG. 2B shows a procedure for fabricating elements of a qubit chip, according to an example.

The procedure may comprise bonding the first qubit wafer 11 to the spacer element 12 via the first SC bumps 16A or the first SC pads on the first qubit wafer and the second SC bumps 16B or the second SC pads on the first spacer wafer, as it is shown in FIG. 2B.

The present disclosure is not limited to a specific bonding of the two or more qubit wafers 11, 13 and one or more spacer elements 12, 14. For example, wafer-to-wafer (W2W) bonding between a qubit wafer 11 and a spacer element 12 being a spacer wafer may also be done through SC pads (not shown in FIG. 2B). In this case, an indium pad may be provided on the qubit wafer 11 and an indium pad may be provided on the spacer element 12. Moreover, the first qubit wafer 11 may be bonded to the spacer element 12 via the provided indium pads on the first qubit wafer 11 and the provided indium pads on the first spacer wafer. The bonding process through only indium pads may improve the scalability of manufacturing the qubit chip. For example, the W2W bonding through only indium pads may be used for more aggressive pitches such as pitches less than 7 μm.

Furthermore, the procedure may comprise bonding the second qubit wafer 13 to the second spacer element 14 via the first SC bumps 16A or the first SC pads on the second qubit wafer 13 and the second SC bumps 16B or the second SC pads on the second spacer element 14.

Figure 2C:
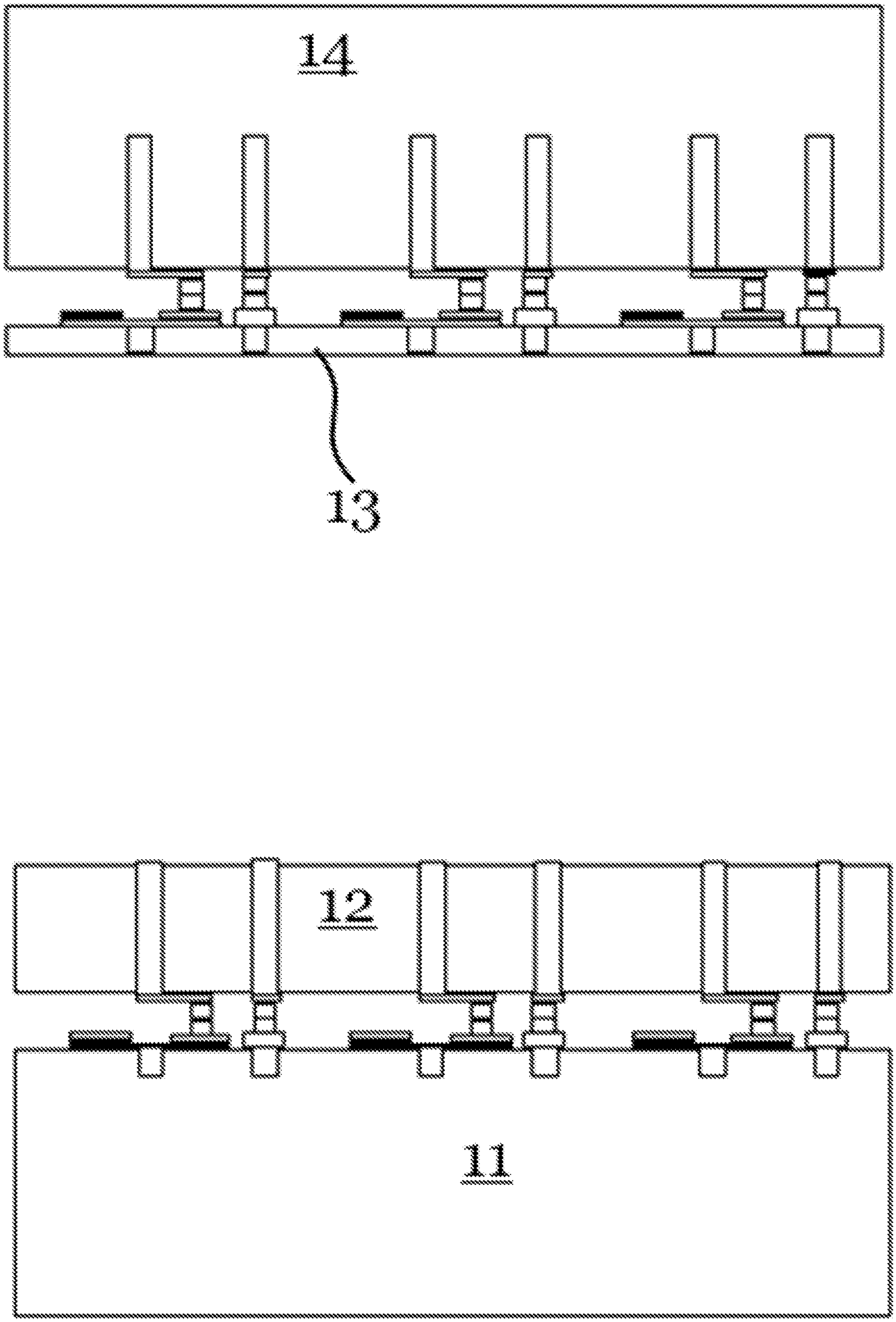
FIG. 2C shows a procedure for fabricating elements of a qubit chip, according to an example.

As it is shown in FIG. 2C, the procedure may comprise thinning the spacer element 12 and the second qubit wafer 13.

Figure 2D:
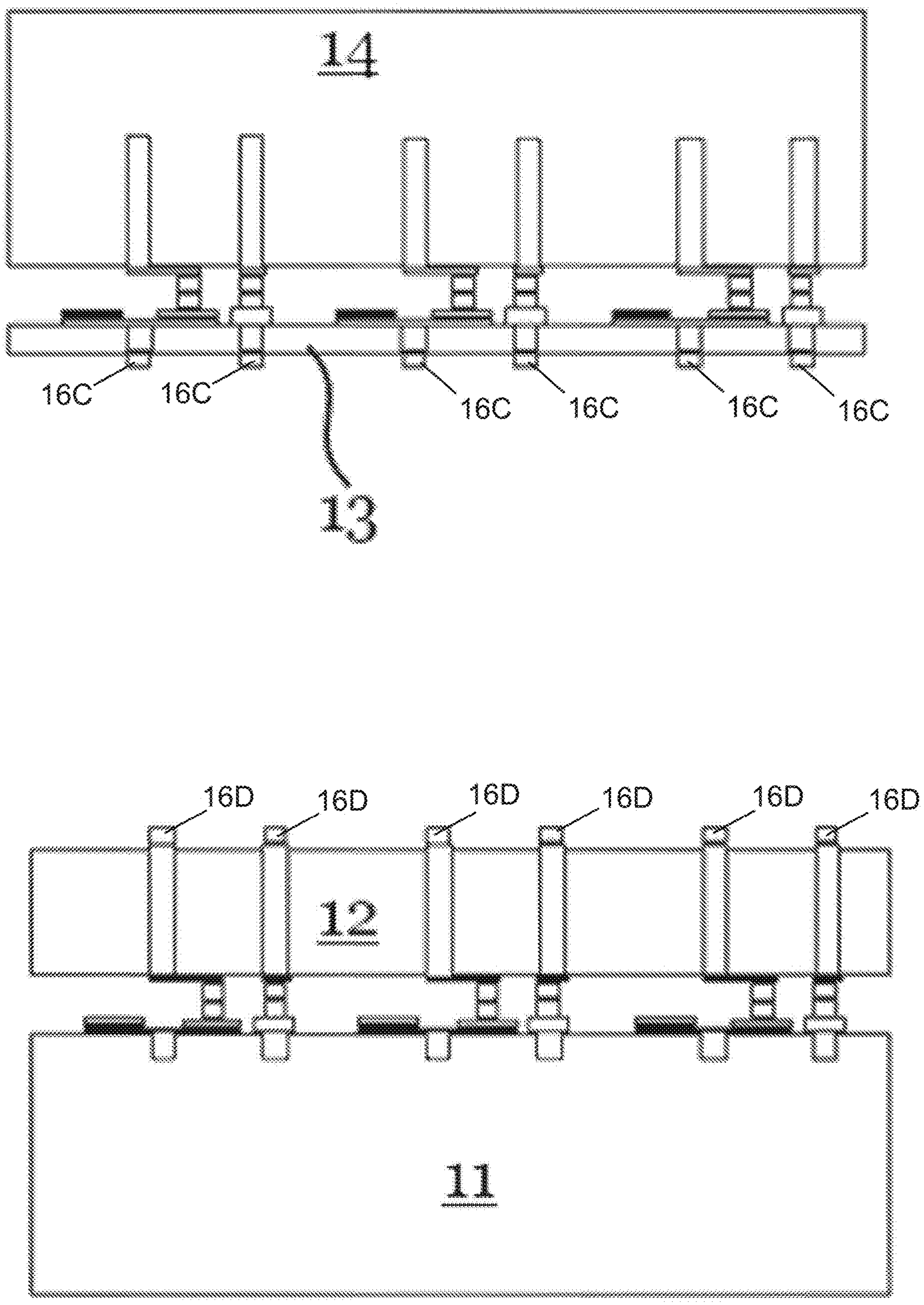
FIG. 2D shows a procedure for fabricating elements of a qubit chip, according to an example.

In FIG. 2D, the procedure may comprise providing a plurality of third SC bumps 16C or third SC pads onto the thinned second qubit wafer 13, and providing a plurality of fourth SC bumps 16D or fourth SC pads onto the thinned spacer element 12.

Figure 2E:
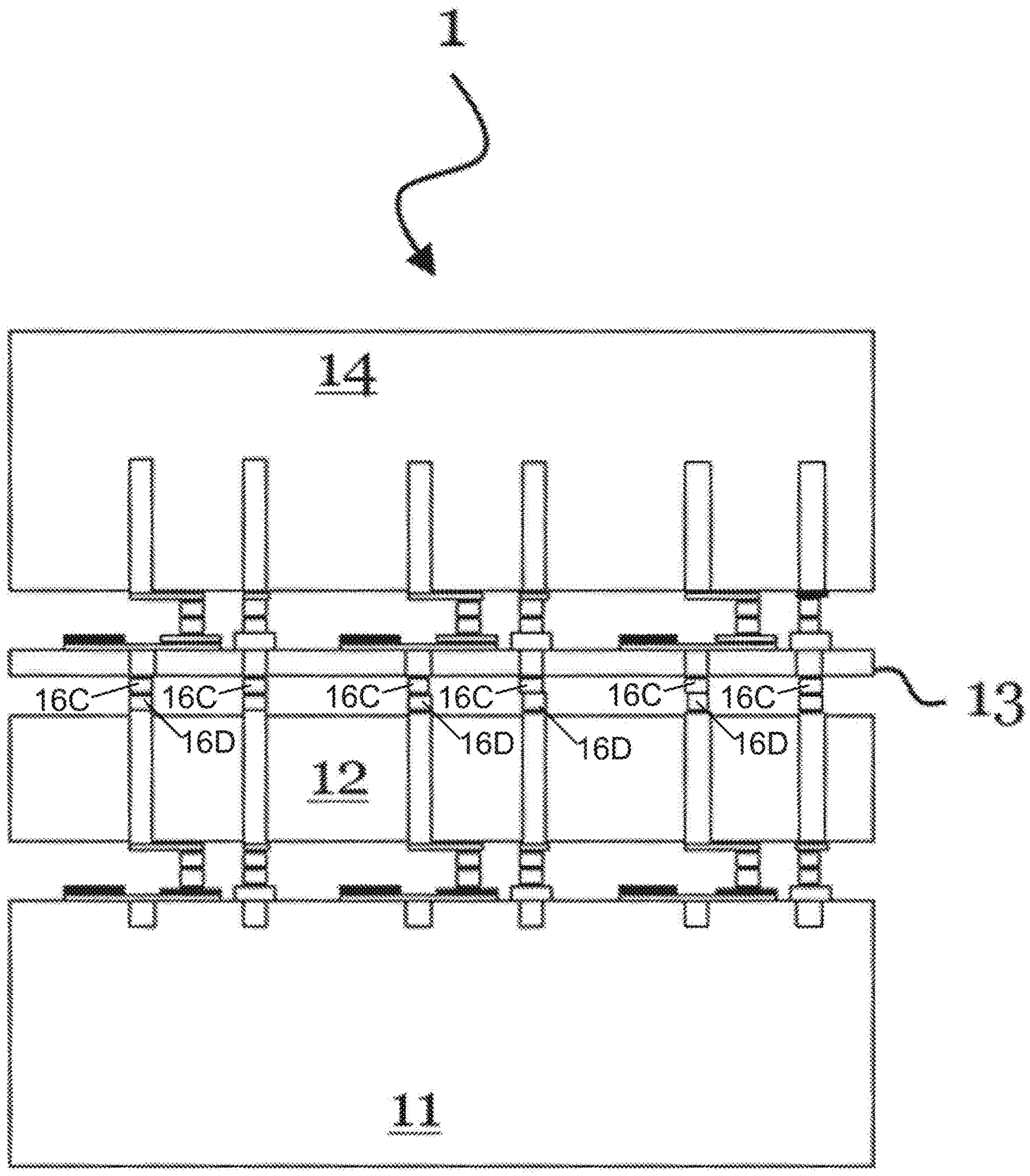
FIG. 2E shows a procedure for fabricating elements of a qubit chip, according to an example.

Furthermore, a first stack 1 of the qubit chip 10 may be obtained, as it is shown in FIG. 2E.

For example, the procedure may comprise bonding the thinned second qubit wafer 13 to the thinned spacer element 12 via the third SC bumps 16C or the third SC pads on the thinned second qubit wafer 13 and the fourth SC bumps 16D or fourth SC pads on the thinned spacer element 12, in order to obtain a first stack 1 for the qubit chip 10.

Figure 2F:
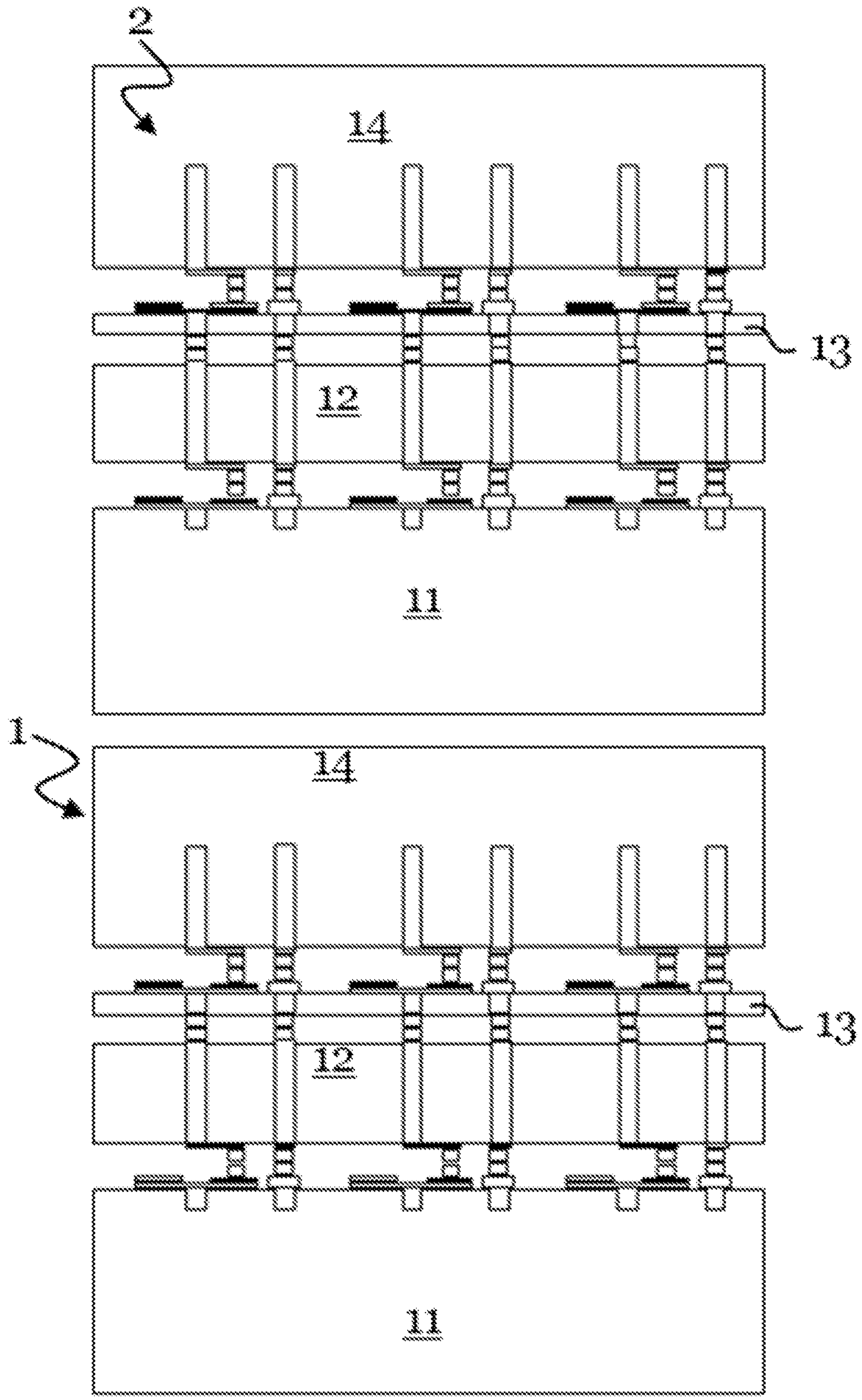
FIG. 2F shows a procedure for fabricating elements of a qubit chip, according to an example.

Reference is now made to FIG. 2F, in which a second stack 2 of the qubit chip is provided.

For example, the procedure may comprise providing a second stack 2 for the qubit chip 10, the second stack 2 being substantially identical to the first stack 1.

Figure 2G:
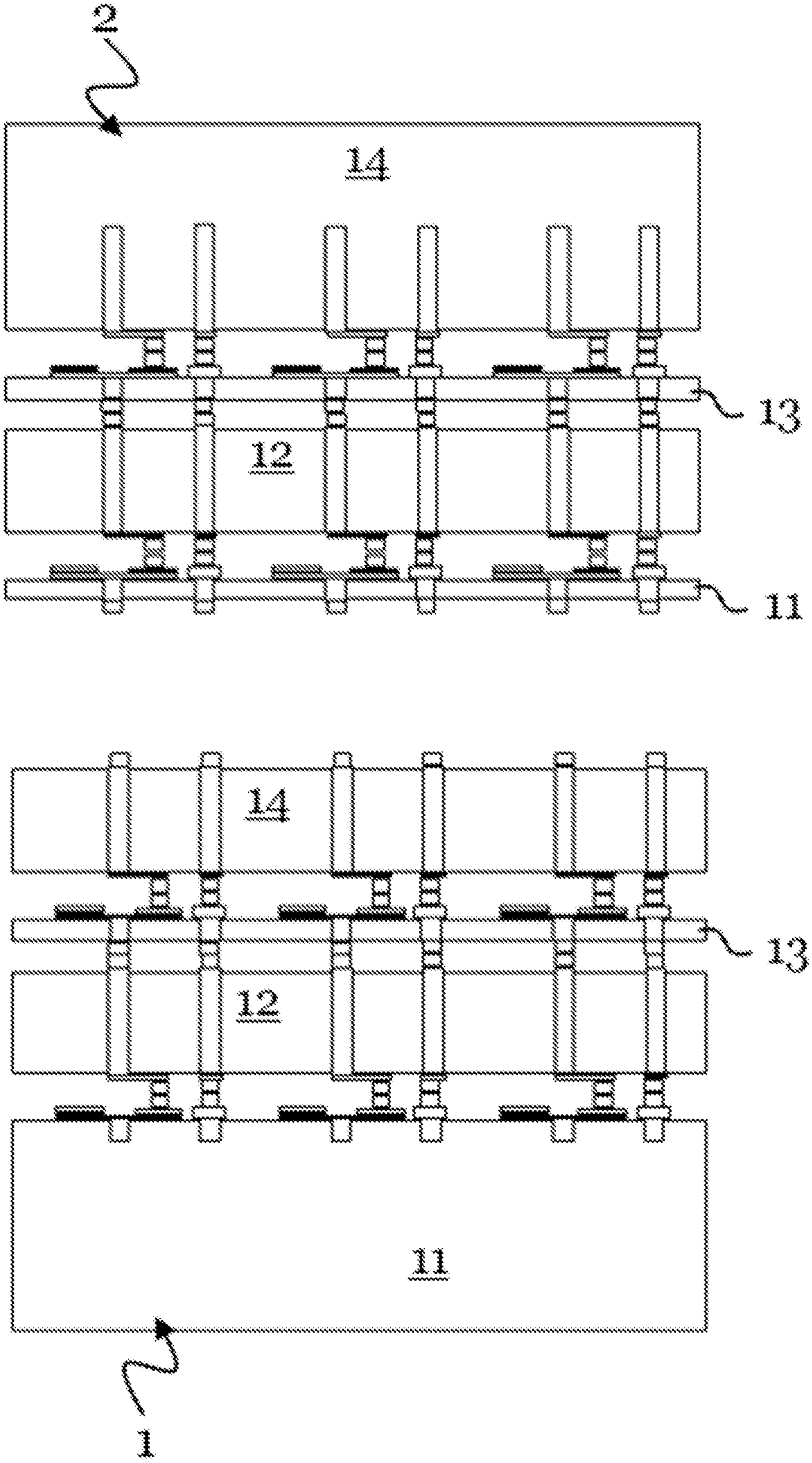
FIG. 2G shows a procedure for fabricating elements of a qubit chip, according to an example.

Furthermore, as it is shown in FIG. 2G, the procedure may comprise thinning the second spacer element 14 of the first stack 1 and the first qubit wafer 11 of the second stack 2. The procedure may further comprise providing a plurality of fifth SC bumps or fifth SC pads onto the thinned first qubit wafer 11 of the second stack 2, and providing a plurality of sixth SC bumps or sixth SC pads onto the thinned second spacer element 14 of the first stack 1.

Figure 2H:
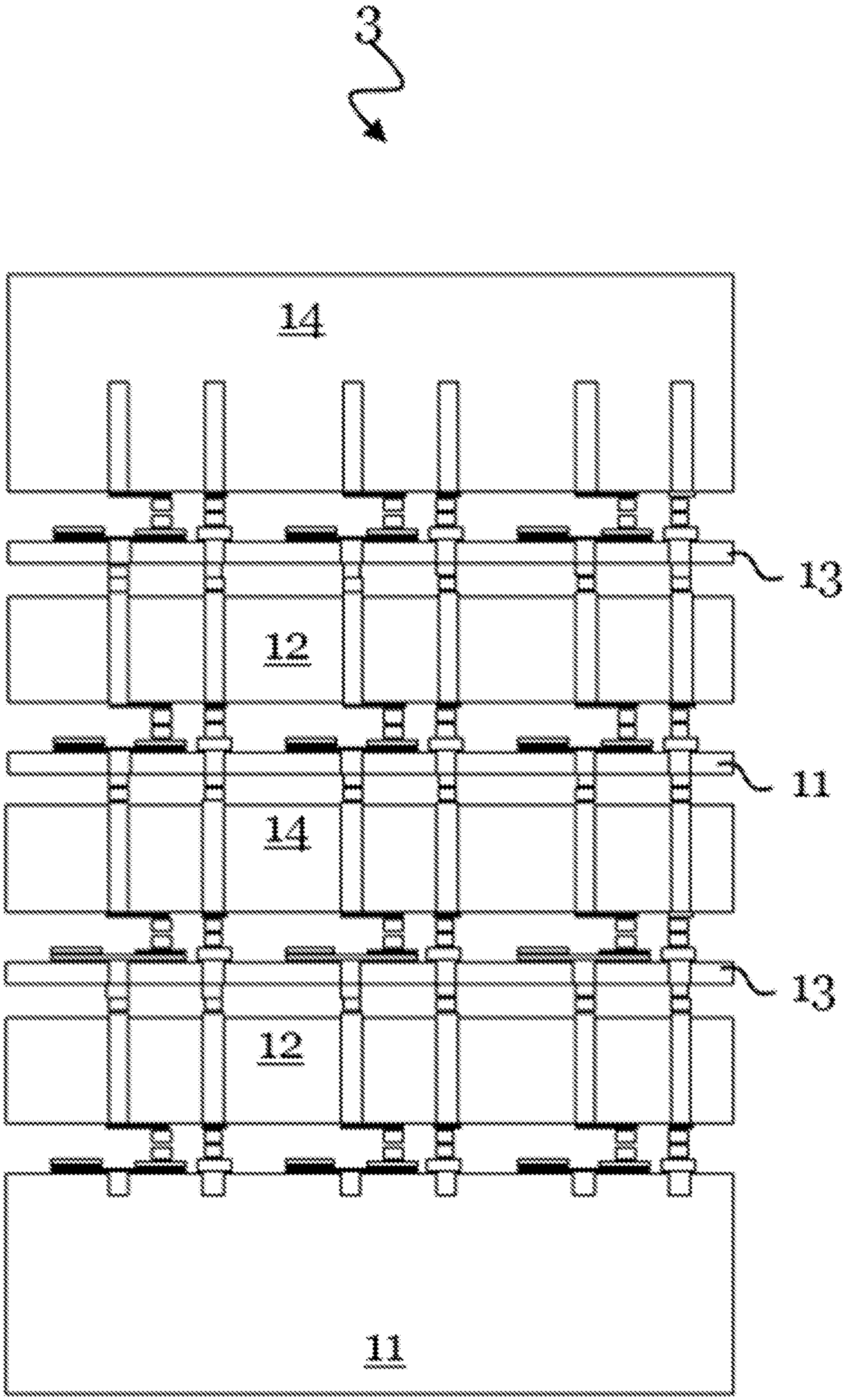
FIG. 2H shows a procedure for fabricating elements of a qubit chip, according to an example.

Furthermore, as it is shown in FIG. 2H, the procedure may comprise bonding the thinned first qubit wafer 11 of the second stack 2 to the thinned second spacer element 14 of the first stack 1, via the fifth SC bumps or the fifth SC pads on the thinned first qubit wafer of the second stack 2 and via the sixth SC bumps or sixth SC pads on the thinned second spacer element 14 of the first stack 1, in order to obtain a third stack 3, as it shown in FIG. 2H.

For example, the first qubit wafer 11 and/or the second qubit wafer 13 may be thinned to less than 1 μm, for example, to within a range of 400-600 nm, and/or the spacer element 12 and/or the second spacer element 14 are thinned to less than 100 μm, for example, to within a range of 50-100 μm.

Figure 2I:
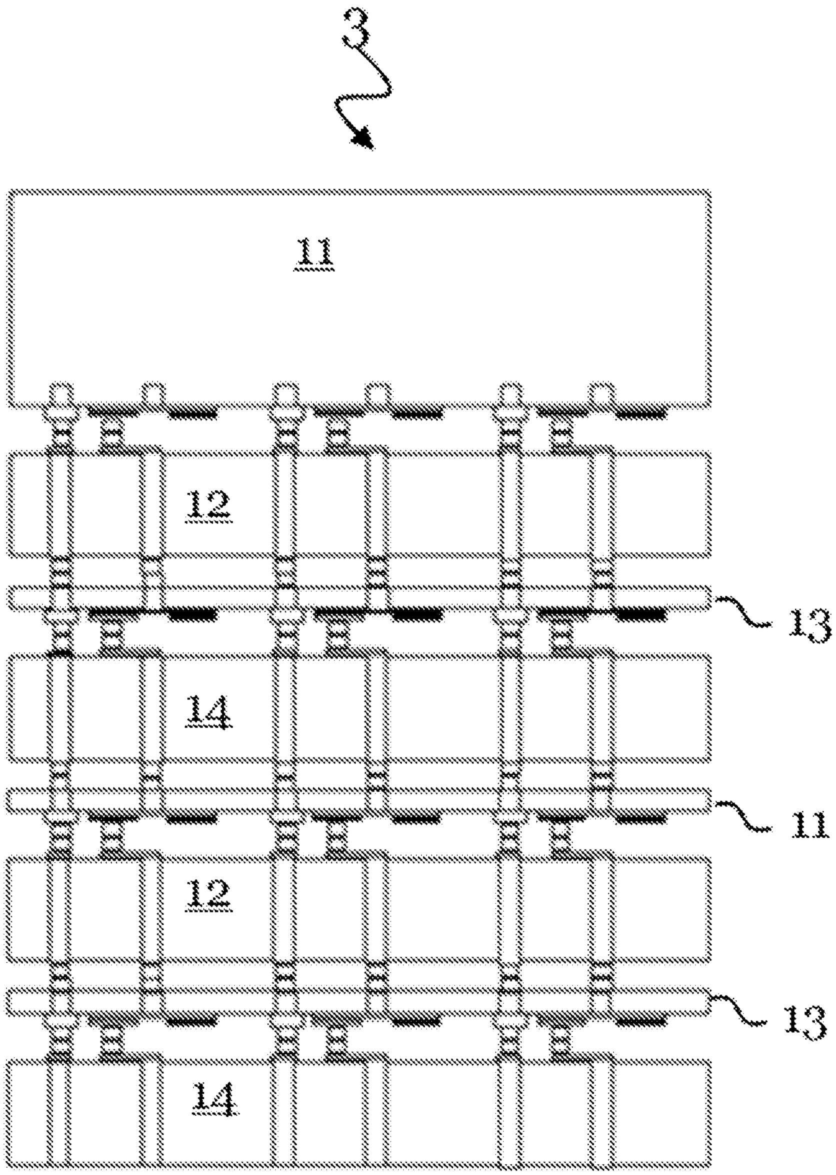
FIG. 2I shows a procedure for fabricating elements of a qubit chip, according to an example.
Figure 2J:
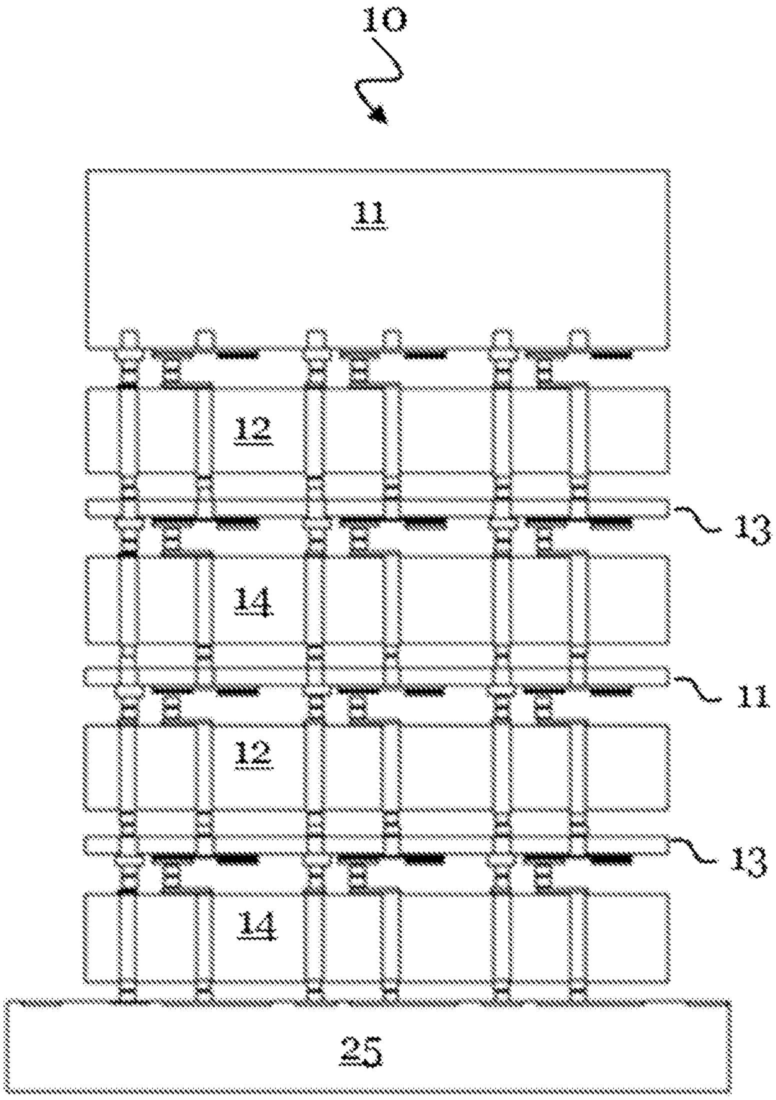
FIG. 2J shows a procedure for fabricating elements of a qubit chip, according to an example.

Reference is now made to FIG. 2I, and the procedure may further comprise thinning a further spacer element 14 of the third stack 3.

Furthermore, the procedure may comprise providing a device 25 (e.g., a CMOS readout wafer), and connecting the thinned further spacer element 14 of the third stack 3 to the CMOS readout wafer or device 25, in order to obtain the qubit chip 10.

The qubit wafers 11, 13 may comprise a plurality of qubit devices, and the plurality of qubit devices may comprise an SC qubit device and/or a spin qubit device. For example, the qubit wafers 11, 13 may be based on superconducting or spin qubits. Further, the qubit wafers 11, 13 may be designed or partitioned such that each qubit wafer includes different types of qubit devices.

The conductive arrangement 15 of the qubit chip 10 may electrically connect the plurality of qubit devices of the two or more qubit wafers 11, 13.

The two or more qubit wafers 11, 13 and the one or more spacer elements 12, 14 are alternately arranged on the common axis. For example, each spacer element from the spacer elements 12, 14 may be arranged in between two successive wafers including the device 25 and the qubit wafers 11, 13.

Moreover, a spacer element 12 is arranged in between two successive qubit wafers 11, 13, in order to maintain enough gap between two qubit wafers and to prevent electromagnetic interference (EMI). The qubit wafers 11, 13 may comprise an SC nano via or SC-nano through silicon via (SC-nTSVs). Further, the spacer elements 12, 14, may comprise an SC via or an SC-TSV. The TSVs and SC metal layers formed in the spacer elements 12, 14 may be part of a capacitor or an inductor of a resonator obtained by coupling or direct connection through micro-bumps.

Furthermore, the SC-nTSVs in the qubit wafers 11, 13 and a high aspect ratio of SC-TSVs in the spacer elements 12, 14 may provide more efficient and higher density of interconnection, and might not have an impact on resonators' Q factor and the coherence of qubit devices.

Furthermore, the indium bumps or pads may provide a connection between the two qubit wafers 11, 13.

The processing of the qubit wafers 11, 13 and the spacer elements 12, 14 may be based on W2W bonding and multi wafer stacking in a form of $N=2^n$, where N is the number of total stacked wafers (including a number of qubit wafers plus a number of spacer elements, or a number of qubit wafers plus a number of spacer wafers), and n is a number of times in which the W2W bonding operations are performed.

The qubit chip 10 further comprises the CMOS readout wafer or device 25. The CMOS readout wafer or device 25 is configured to readout one or more qubits of each qubit wafer 11, 13 or to selectively couple each qubit to a readout resonator and/or to a microwave driver. For instance, the diced multi-tier qubit/spacer chip having $N=2^n$ number of qubit wafers and spacer wafers can be assembled on the readout CMOS wafer or device 25 in the form of D2W bonding, as discussed above.

Figure 3:
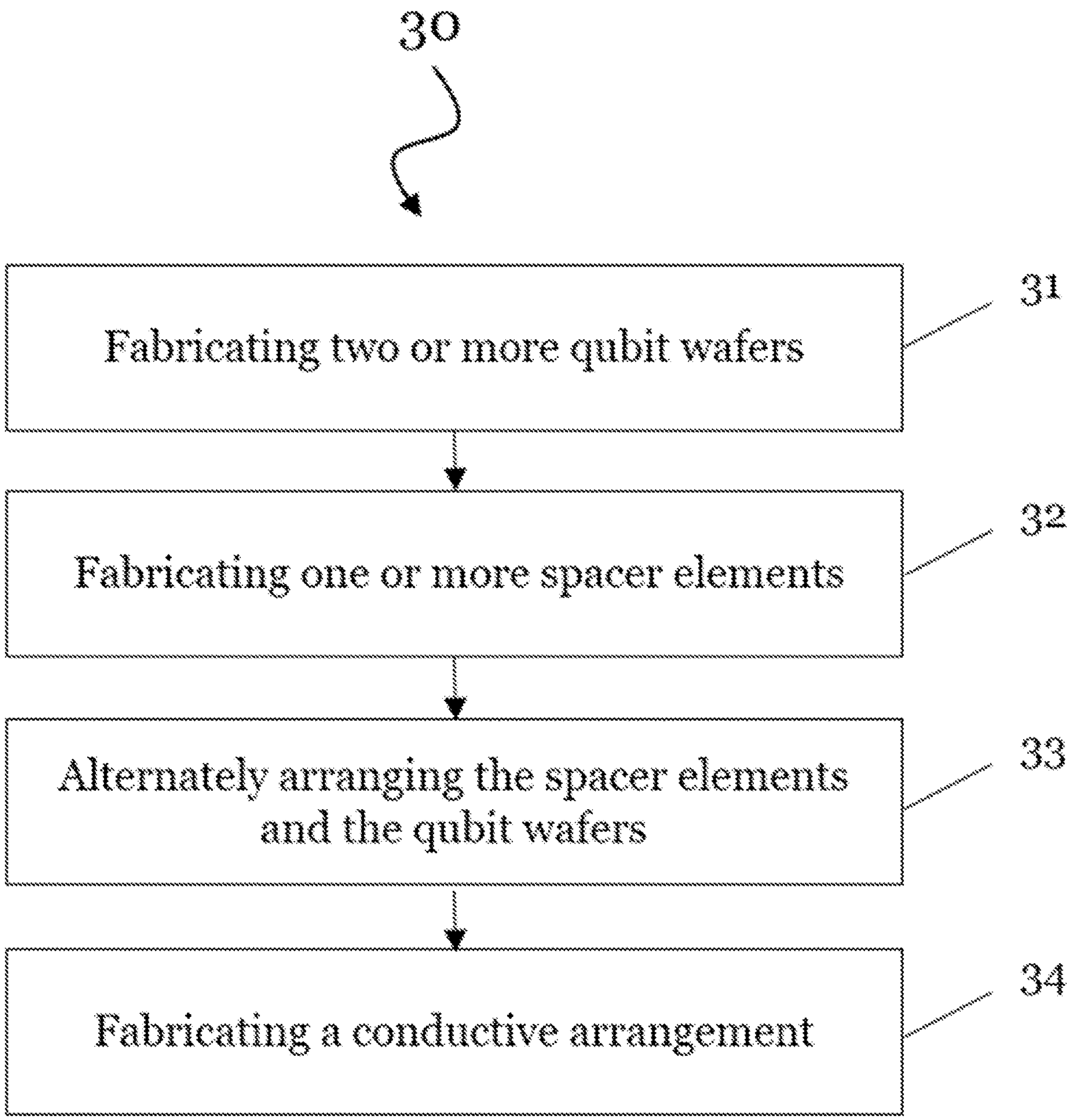
FIG. 3 shows a method for fabricating a qubit chip, according to example.

FIG. 3 shows a method 30 for fabricating a qubit chip 10, according to an example.

The method 30 comprises a step 31 of fabricating two or more qubit wafers 11, 13.

The method 30 further comprises a step 32 of fabricating one or more spacer elements 12, 14.

The method 30 further comprises a step 33 of alternately arranging the spacer elements 12, 14 and the qubit wafers 11, 13 on a common axis.

The method 30 further comprises a step 34 of fabricating a conductive arrangement 15, wherein the conductive arrangement 15 is configured to electrically connect the two or more qubit wafers 11, 13, wherein the conductive arrangement 15 comprises at least one SC via per each respective qubit wafer of the two or more qubit wafers 11, 13 and each respective element of the one or more spacer elements 12, 14, the at least one SC via passing through the respective wafer or spacer element.

In summary, the embodiments of the disclosure can provide various potential benefits. For instance:

Increasing a density of qubit devices by removing the lateral interconnects.

Providing a scalable approach for combining different qubit devices.

Enhancing the performance of high Q resonators for quantum memories.

Providing qubit wafers with high quantum coherence.

Reducing interconnect density in the plane of the qubit wafers.

Reducing the complexity in quantum error correction algorithms hence increasing the number of qubits.

Providing an efficient vertical signal routing.

Providing an efficient lateral signal routing.

Selectively coupling qubit wafers to a CMOS readout.

Providing a shield between qubit wafers while carrying current vertically.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A qubit chip comprising:

two or more qubit wafers arranged along a common axis, wherein each of the two or more qubit wafers comprises a plurality of qubit devices;

one or more spacer elements, wherein the one or more spacer elements and the two or more qubit wafers are alternately arranged on the common axis; and a conductive arrangement configured to electrically connect the two or more qubit wafers, wherein the conductive arrangement comprises at least one superconducting via per each qubit wafer of the two or more qubit wafers and each spacer element of the one or more spacer elements, the at least one superconducting via passing through the two or more qubit wafers or the one or more spacer elements, and wherein the one or more spacer elements comprise one or more spacer wafers, and wherein a thickness of each spacer wafer of the one or more spacer wafers is larger than a thickness of each qubit wafer of the two or more qubit wafers.

2. The qubit chip according to claim 1, wherein the two or more qubit wafers are arranged one above the other.

3. The qubit chip according to claim 1, wherein the conductive arrangement comprises:

a superconducting bump configured to electrically couple a qubit wafer of the two or more qubit wafers to a spacer element of the one or more spacer elements.

4. The qubit chip according to claim 1, wherein the conductive arrangement comprises: a partial superconducting bump configured to electrically couple a qubit wafer of the two or more qubit wafers to a spacer element of the one or more spacer elements.

5. The qubit chip according to claim 1, further comprising:

a complementary metal-oxide semiconductor (CMOS) readout wafer, wherein the CMOS readout wafer is configured to readout one or more qubits of each qubit wafer of the two or more qubit wafers, or to selectively couple each of the one or more qubits to a readout resonator and/or to a microwave driver.

6. The qubit chip of claim 1, wherein the one or more spacer elements comprise a graphene sheet.

7. The qubit chip of claim 1, wherein the one or more spacer elements comprise graphene.

8. The qubit chip according to claim 1, wherein the plurality of qubit devices comprise at least one of a superconducting qubit device or a spin qubit device.

9. The qubit chip according to claim 8, wherein each of the two or more qubit wafers comprises one or more interconnects configured to electrically connect the plurality of qubit devices.

10. The qubit chip according to claim 8, wherein the conductive arrangement is configured to electrically connect the plurality of qubit devices.

11. The qubit chip of claim 1, wherein the two or more qubit wafers comprise a first qubit wafer and a second qubit wafer that is thinner along the common axis than the first qubit wafer.

12. The qubit chip of claim 11, wherein the one or more spacer elements comprise a first spacer element and a second spacer element that is thinner along the common axis than the first spacer element.

13. The qubit chip of claim 12, wherein the second qubit wafer is between the first spacer element and the first qubit wafer.

14. The qubit chip of claim 12, wherein the second qubit wafer is between the first spacer element and the second spacer element.

15. A method for fabricating a qubit chip, the method comprising:

fabricating two or more qubit wafers, wherein each of the two or more qubit wafers comprises a plurality of qubit devices;

fabricating one or more spacer elements;

alternately arranging the one or more spacer elements and the two or more qubit wafers on a common axis; and fabricating a conductive arrangement, wherein the conductive arrangement is configured to electrically connect the two or more qubit wafers, wherein the conductive arrangement comprises at least one superconducting via per each qubit wafer of the two or more qubit wafers and each spacer element of the one or more spacer elements, the at least one superconducting via passing through the two or more qubit wafers or the one or more spacer elements, and wherein the one or more spacer elements comprise one or more spacer wafers, and wherein a thickness of each spacer wafer of the one or more spacer wafers is larger than a thickness of each qubit wafer of the two or more qubit wafers.

16. The method of claim 15, wherein the one or more spacer elements comprise a graphene sheet.

17. The method of claim 15, wherein:

the fabricating the two or more qubit wafers comprises fabricating a first qubit wafer and a second qubit wafer, the fabricating the one or more spacer elements comprises fabricating a first spacer wafer and a second spacer wafer, and the fabricating the conductive arrangement comprises:

providing a plurality of first superconducting bumps onto the first qubit wafer and the second qubit wafer, and providing a plurality of second superconducting bumps onto the first spacer wafer and the second spacer wafer; and wherein the method further comprises:

bonding the first qubit wafer to the first spacer wafer via the first superconducting bumps on the first qubit wafer and the second superconducting bumps on the first spacer wafer; and bonding the second qubit wafer to the second spacer wafer via the first superconducting bumps on the second qubit wafer and the second superconducting bumps on the second spacer wafer; and thinning the first spacer wafer and the second qubit wafer.

18. The method of claim 17, wherein the method further comprises:

providing a plurality of third superconducting bumps onto the second qubit wafer;

providing a plurality of fourth superconducting bumps onto the first spacer wafer; and bonding the second qubit wafer to the first spacer wafer via the third superconducting bumps on the second qubit wafer and the fourth superconducting bumps on the first spacer wafer, to obtain a first stack for the qubit chip.

19. The method of claim 18, further comprising:

providing a second stack for the qubit chip, the second stack being substantially identical to the first stack;

thinning the second spacer wafer of the first stack and the first qubit wafer of the second stack;

providing a plurality of fifth superconducting bumps onto the first qubit wafer of the second stack;

providing a plurality of sixth superconducting bumps onto the second spacer wafer of the first stack; and bonding the first qubit wafer of the second stack to the second spacer wafer of the first stack, via the fifth superconducting bumps on the first qubit wafer of the second stack and via the sixth superconducting bumps on the second spacer wafer of the first stack, to obtain a third stack.

20. The method of claim 19, further comprising:

thinning a further spacer wafer of the third stack;

providing a complementary metal-oxide-semiconductor (CMOS) readout wafer; and connecting the thinned further spacer wafer of the third stack to the CMOS readout wafer, to obtain the qubit chip.

* * * * *